(12) United States Patent
Muijderman et al.

(10) Patent No.: US 7,145,634 B2
(45) Date of Patent: Dec. 5, 2006

(54) LITHOGRAPHIC APPARATUS AND DEVICE MANUFACTURING METHOD

(75) Inventors: Johannes Hendrik Everhardus Aldegonda Muijderman, Veldhoven (NL); Johannes Adrianus Antonius Theodorus Dams, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 96 days.

(21) Appl. No.: 11/000,373

(22) Filed: Dec. 1, 2004

(65) Prior Publication Data

US 2006/0114439 A1   Jun. 1, 2006

(51) Int. Cl.
*G03B 27/42* (2006.01)

(52) U.S. Cl. .............................. 355/53; 355/67; 355/71; 378/34; 430/30

(58) Field of Classification Search .................... None
See application file for complete search history.

(56) References Cited

U.S. PATENT DOCUMENTS

| | | | |
|---|---|---|---|
| 4,778,263 A * | 10/1988 | Foltyn | 359/580 |
| 5,329,350 A * | 7/1994 | Wright et al. | 356/218 |
| 5,339,346 A * | 8/1994 | White | 378/34 |
| 6,404,499 B1 * | 6/2002 | Stoeldraijer et al. | 356/400 |
| 6,741,329 B1 * | 5/2004 | Leenders et al. | 355/53 |
| 6,762,823 B1 * | 7/2004 | Suzuki | 355/52 |
| 6,781,732 B1 * | 8/2004 | Cho et al. | 359/224 |
| 2005/0140957 A1 * | 6/2005 | Luijkx et al. | 355/71 |
| 2005/0270513 A1 * | 12/2005 | Dierichs et al. | 355/67 |

* cited by examiner

*Primary Examiner*—D. Rutledge
(74) *Attorney, Agent, or Firm*—Pillsbury Winthrop Shaw Pittman, LLP

(57) ABSTRACT

A lithographic apparatus including an illumination system configured to condition a radiation beam is described. The illumination system includes radiation beam uniformity adjuster for adjusting the uniformity of the radiation beam using segments that are at least partly arranged in the radiation beam and that are mounted on a frame by a torsion bar. The device further includes an actuator configured to rotate the segment in order to change the amount of radiation of the radiation beam that is blocked. The device also includes a first magnetic member mounted on the torsion bar configured to co-operate with a second magnetic member mounted on the frame for generating a position dependent torque about the longitudinal axis that is configured to at least partly compensate a torque exerted on the segment by the torsion bar.

27 Claims, 14 Drawing Sheets

LITHOGRAPHIC APPARATUS AND DEVICE MANUFACTURING METHOD

FIELD

The present invention relates to a lithographic apparatus and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The lithographic apparatus may include a device for adjusting the uniformity of the radiation beam. Such a device may include a plurality of segments (also referred to as blades or vanes) that may be adjusted in order to block, deflect or attenuate part of the radiation beam. An example of such a device can be found in EP 1291721. In order to make the adjustments, the device can be equipped with a plurality of actuators for adjusting the blades or vanes.

The use of a radiation beam of e.g. UV-light or EUV-light may pose strict requirements with respect to the purity of the environment of the beam. Devices that operate near the radiation beam may therefore be subject to stringent requirements to avoid contamination due to e.g. outgassing or particles. These requirements may pose restrictions to the construction of the devices and to the materials that are applied. As an example, the use of ball- or sleeve bearing may be restricted due to the risk of particle contamination. Materials such as epoxy resins or insulators that are applied in commercially available actuators may pose a risk of outgassing. Ball- or sleeve bearings may also give rise to friction forces causing an unwanted non-linear system behavior. Furthermore, such bearings may give rise to unwanted play and therefore introduce inaccuracies in the positioning of the segment.

In addition to that, the device may be subject to severe operating conditions due to e.g. the thermal load on the segments of the device. As a consequence, the operating temperature of the actuators may be high compared to the allowable temperature of commercially available actuators. Due to the available volume and the requirements with respect to the dimensions of the adjustable segments, the available volume for the actuators may also complicate the use of commercially available actuators.

SUMMARY

Embodiments of the present invention include an improved device configured to adjust the uniformity of a radiation beam. Such a device may advantageously be applied in an illumination system of a lithographic apparatus.

According to an embodiment of the invention, there is provided a lithographic apparatus including: an illumination system configured to condition a radiation beam, the illumination system including a device configured to adjust the uniformity of the radiation beam, including a segment that is at least partly arranged in the radiation beam in order to block an amount of radiation of the radiation beam, the segment being mounted on a frame by a torsion bar, an actuator configured to rotate the segment about an axis substantially parallel to a longitudinal axis of the torsion bar in order to change the amount of radiation of the radiation beam that is blocked, a first magnetic member mounted on the torsion bar configured to co-operate with a second magnetic member mounted on the frame for generating a position dependent torque about the longitudinal axis that, in use, at least partly compensates a torque exerted on the segment by the torsion bar.

According to another embodiment of the present invention there is provided a device manufacturing method including providing a radiation beam, adjusting the uniformity of the radiation beam using a device including a segment that is at least partly arranged in the radiation beam in order to block an amount of radiation of the radiation beam, the segment being mounted on a frame by a torsion bar, an actuator configured to rotate the segment about an axis substantially parallel to a longitudinal axis of the torsion bar in order to change the amount of radiation of the radiation beam that is blocked, a first magnetic member mounted on the torsion bar configured to co-operate with a second magnetic member mounted on the frame for generating a position dependent torque about the longitudinal axis that, in use, at least partly compensates a torque exerted on the segment by the torsion bar, and projecting a patterned beam of radiation onto a substrate.

It is noted that a magnetic member may include soft magnetic materials such as ferromagnetic alloys and/or hard magnetic materials such as permanent magnets.

By generating a position dependent torque that at least partly compensates a torque of the torsion bar, the actuator requirements such as the required torque to rotate the segment may be reduced. The reduced requirement with respect to torque may, in case of an electromagnetic actuator, result in a smaller current requirement. As a result, the dimensions of the wiring to the actuator may be reduced, as well as the requirements for the power supply of the actuator. A reduction of the current requirements may result in a reduction of generated dissipation and heat generation. This may result in a decrease in cooling requirement and in an overall improvement of the performance of the illumination system. A reduction in current requirement may also advantageously affect the influence of the actuator on the surrounding due to inductive coupling.

In an embodiment of the present invention, the actuator includes a coil configured to co-operate with the first magnetic member for rotating the segment. By doing so, the volumetric requirements may be reduced.

A lithographic apparatus in accordance with an embodiment of the invention includes: an illumination system configured to condition a radiation beam, the illumination system including a radiation beam uniformity adjuster configured to adjust the uniformity of the radiation beam, the radiation beam uniformity adjuster including i) a segment that is at least partly arranged in the radiation beam to block an amount of radiation of the radiation beam, the segment being mounted on a frame by a torsion bar; ii) an actuator configured to rotate the segment about an axis substantially parallel to a longitudinal axis of the torsion bar to change the amount of radiation of the radiation beam that passes by the segment, and iii) a first magnetic member mounted on the torsion bar, the first magnetic member being configured to co-operate with a second magnetic member mounted on the frame to generate a position dependent torque about the longitudinal axis that is configured to at least partly compensate a torque exerted on the segment by the torsion bar; (b) a support structure configured to support a patterning device, the patterning device configured to pattern the radiation beam according to a desired pattern; (c) a substrate table configured to hold a substrate, and (d) a projection system configured to project the patterned radiation beam onto a target portion of the substrate.

A device manufacturing method, in accordance with an embodiment of the invention, includes: adjusting a uniformity of a radiation beam by i) blocking an amount of radiation of the radiation beam with a segment that is at least partly arranged in the radiation beam, the segment being mounted on a frame by a torsion bar, ii) rotating the segment about an axis substantially parallel to a longitudinal axis of the torsion bar to change the amount of radiation of the radiation beam, and iii) generating a position dependent torque about the longitudinal axis that is configured to at least partly compensate a torque exerted on said segment by the torsion bar by use of a first magnetic member mounted on the torsion bar and a second magnetic member mounted on the frame, and c) projecting a patterned beam of radiation onto a substrate.

A radiation beam uniformity adjuster configured to adjust a uniformity of a radiation beam in a lithographic apparatus, in accordance with an embodiment of the invention, includes a segment mounted on a frame by a torsion bar, the segment being at least partly arranged in the radiation beam to block an amount of radiation of the radiation beam that passes by said segment; an actuator configured to rotate the segment about an axis substantially parallel to a longitudinal axis of the torsion bar to change the amount of radiation of the radiation beam, and a first magnetic member mounted on the torsion bar, the first magnetic member being configured to co-operate with a second magnetic member mounted on the frame to generate a position dependent torque about the longitudinal axis that is configured to at least partly compensate a torque exerted on the segment by the torsion bar.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
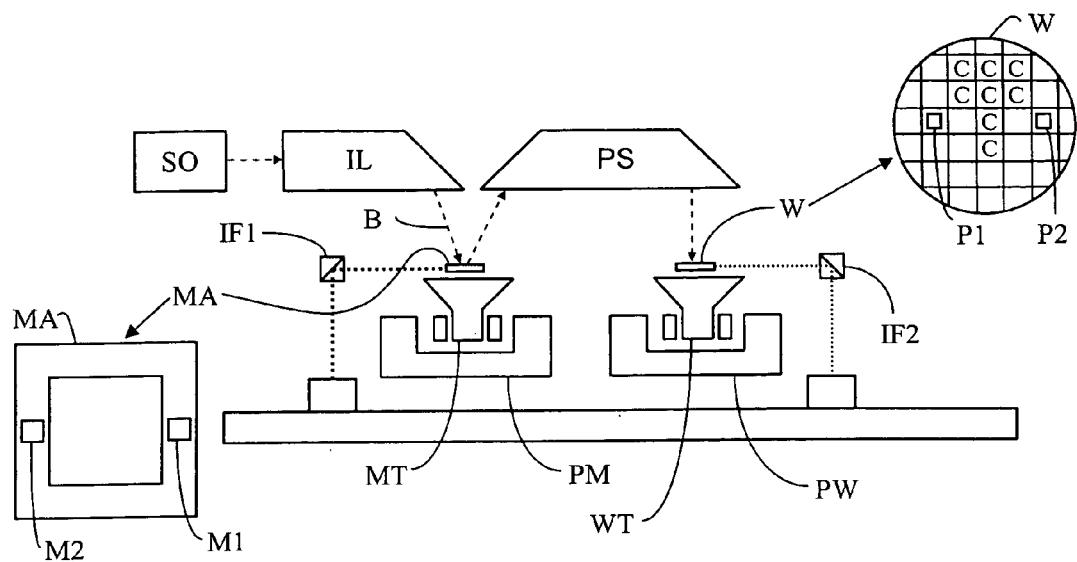
FIG. 1 depicts a lithographic apparatus according to an embodiment of the invention.

FIG. 1 schematically depicts a lithographic apparatus according to one embodiment of the invention. The apparatus includes: an illumination system (illuminator) IL configured to condition on a radiation beam B (e.g. UV radiation or EUV radiation), and a support structure (e.g. a mask table) MT constructed to support a patterning device (e.g. a mask) MA and connected to a first positioner PM configured to accurately position the patterning device in accordance with certain parameters. The apparatus also includes a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system including, for example, suitable directing mirrors and/or a beam expander. In other cases the source may be an integral part of the lithographic apparatus, for example when the source is a mercury lamp. The source SO and the illuminator IL, together with the beam delivery system if required, may be referred to as a radiation system.

The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. After being reflected by the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. Step mode: the mask table MT and the substrate table WT are kept essentially stationary, while an entire pattern imparted to the radiation beam is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.

2. Scan mode: the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. Another mode: the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2A:
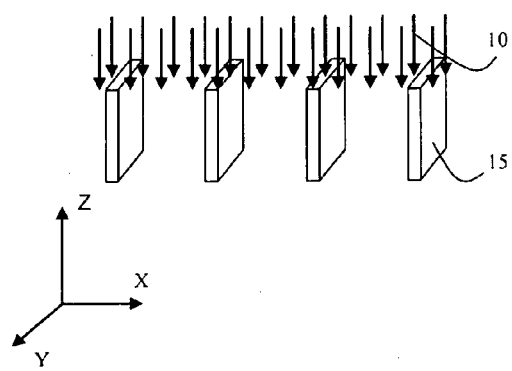
FIG. 2a schematically depicts an array of segments at least partly arranged in a radiation beam.
Figure 2B:
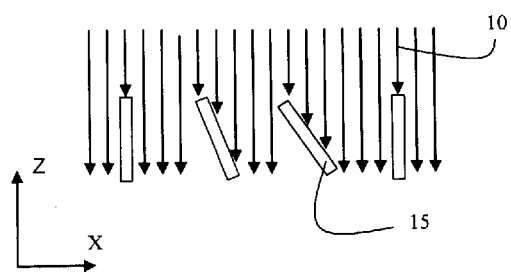
FIG. 2b schematically depicts an array of segments with some segments rotated.
Figure 3A:
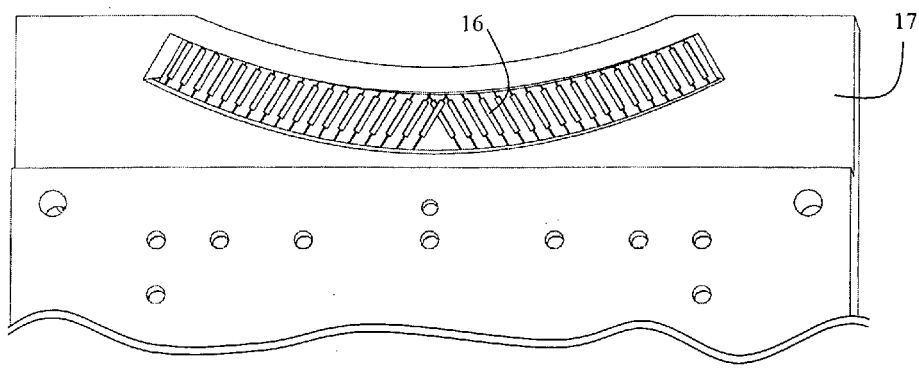
FIG. 3a schematically shows an arrangement of 36 segments relative to a frame.

FIG. 2a schematically depicts a radiation beam 10 and four segments 15, at least partly arranged in the beam. By arranging the segments in the radiation beam, the segments may block an amount of radiation of the radiation beam. By rotating the segments about an axis parallel to the Y-axis, the amount of radiation that is blocked can be changed. (see FIG. 2b). By doing so, the radiation intensity downstream of the segments can be altered. By doing so, the intensity of the radiation beam downstream is altered and can be adjusted in order to correct, as an example, a non-uniformity of the radiation intensity of the beam. The number of segments applied and their size may depend on the purpose of the device, the slit dimensions and the position of the device in the illumination system. Typical values may be 20–50 segments having a width of approx. 2 mm, a length of approx. 10 mm and a thickness of approx. 0.2 mm. FIG. 3a schematically shows a possible arrangement comprising 36 segments 16 positioned relative to a frame 17. Each segment 16 may be connected on one side to a frame and to an actuator (not shown) on the other side. The segments can be connected to the frame using a torsion bar and can be rotated using the actuator. The torsion bar can consist of a wire made of steel or any other alloy or material having the required properties. Relevant properties in this respect may be: a high tensile strength at high temperatures, high emission coefficient, high temperature conduction coefficient. The segment and torsion bar can be made of different parts that are connected when the device is assembled. Methods for assembling the different parts may include welding or gluing. In an embodiment, the segment and torsion bar are made out of one piece. Suitable materials for either the segment or the torsion bar or both are titanium, wolfram, molybdenum or spring steel. The use of a torsion bar or torsion bars may be desirable over the use of bearings (such as ball bearings or sleeve bearings) because of contamination risk. Furthermore, the use of such bearings in precision machines such as a lithographic apparatus may cause unwanted friction forces adding to the driving force and the dissipated heat. Such friction forces may be difficult to predict and may cause an unwanted non-linear system behavior. The use of bearings may also introduce play that may hinder the accurate positioning of the segment.

Figure 3B:
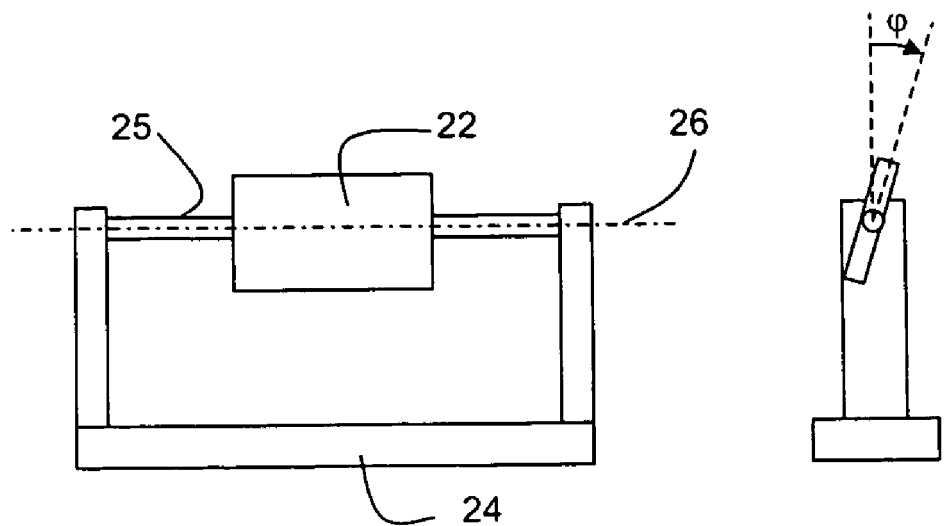
FIG. 3b schematically shows an arrangement of a segment connected to a frame by means of a torsion bar.
Figure 3C:
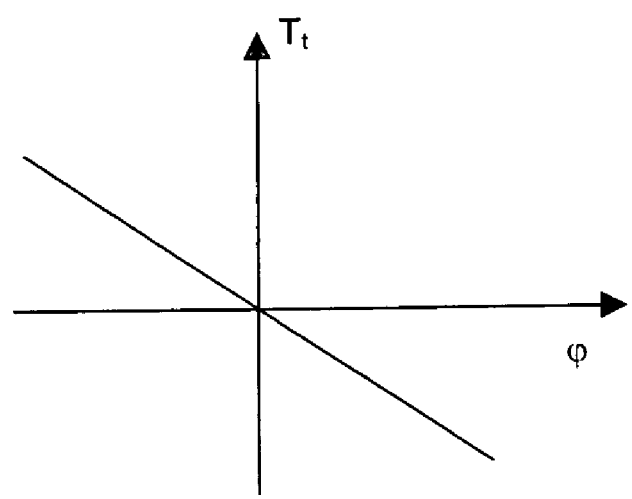
FIG. 3c schematically depicts the torsional stiffness torque as a function of the torsion angle.

As a consequence of using a torsion bar, a torque (due to torsional stiffness) is exerted on the segment when it is rotated about the longitudinal axis of the torsion bar. FIG. 3b schematically shows an arrangement of a segment 22 connected to a frame 24 using a torsion bar 25. When the segment is rotated about the longitudinal axis 26 of the torsion bar (as indicated by the angle $\phi$), a torsional stiffness torque $T_t$ occurs. FIG. 3c schematically depicts the torsional stiffness torque $T_t$ as a function of the angle $\phi$. It is assumed that when $\phi=0°$, the torsion bar is in a neutral position, i.e. substantially free of torsion about its longitudinal axis. In case the torsion bar has a circular cross section, the torsional stiffness torque is found to vary substantially proportional to the torsion bar stiffness and the rotation angle $\phi$. Furthermore, the torsional stiffness torque is directed to oppose the rotational displacement of the segment from the neutral position, i.e. the torque attempts to bring the torsion bar back to this neutral position. As a convention, when the segment is rotated over a positive angle $\phi$, a torque that is directed to oppose this rotation will be indicated as negative. A torque that is directed to increase the positive angular displacement (i.e. directed towards the positive angular displacement) will be indicated as positive. A torque that opposes a negative angular displacement will therefore be indicated as positive, a torque directed to increase a negative angular displacement will be indicated as negative.

Figure 4:
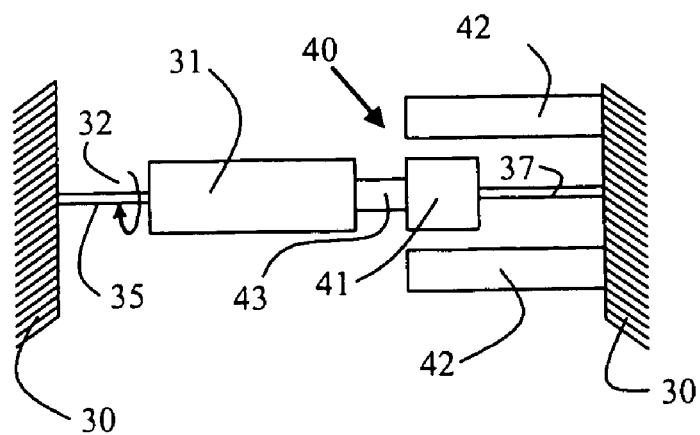
FIG. 4 schematically depicts an arrangement of a frame, a segment and an actuator.

The actuator for rotating a segment or blade may, as an example, include a first part that is mounted to the segment and a second part that is mounted to a frame. FIG. 4 schematically depicts a possible arrangement of a frame, a segment and an actuator. FIG. 4 shows a segment 31 connected on one side to a frame 30 using a torsion bar 35. The other side of the segment is connected to a first part 41 of an actuator 40 using a connection 43. The first part 41 of the actuator 40 is further connected to the frame 30 using a torsion bar 37. The actuator 40 further includes a second part 42 mounted to the frame 30. The segment can be rotated about its longitudinal axis (as indicated by the arrow 32) using the actuator 40. It should be noted that the connection 43 (e.g. a rod or a bar) between the first actuator part 41 and the segment 31 may have a higher torsional stiffness than the torsional stiffness of the torsion bars. By doing so, the relative position of the first actuator part and the segment may remain substantially constant when the segment is rotated. The first actuator part 41 may also be coupled directly to the segment.

Figure 5A:
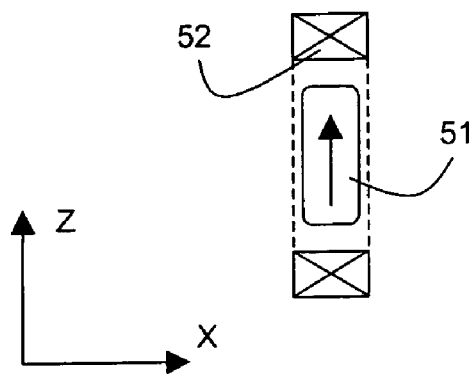
FIG. 5a schematically depicts an electromagnetic actuator comprising a coil and a permanent magnet.
Figure 5B:
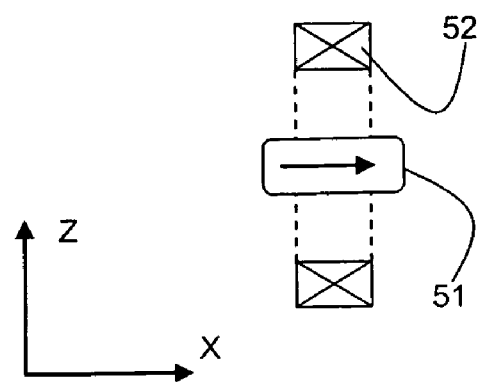
FIG. 5b schematically depicts an electromagnetic actuator wherein the permanent magnet is aligned with the magnetic field generated by a coil.

The actuator 40 for rotating the segment may, as an example, be an electromagnetic actuator. Such an actuator may include a coil and a permanent magnet. FIG. 5a schematically depicts a possible arrangement. The electromagnetic actuator depicted in FIG. 5a includes a permanent magnet 51 and a coil 52. When the coil is supplied with a current, a force will act on the permanent magnet, the force being directed to align the permanent magnet with the magnetic field generated by the current carrying coil. In case the permanent magnet is free to rotate about an axis perpendicular to the Z- and X-axis, directed through the center of the magnet, the permanent magnet could rotate to a position as indicated in FIG. 5b when the coil is energized.

In case such an actuator is used in an arrangement as shown in FIG. 4 (i.e. the permanent magnet 51 of FIG. 5 corresponding to the first actuator part 41 of FIG. 4), the actuator would have to overcome the torsional stiffness torque generated by the torsion bars 35 and 37. Due to this torsional stiffness, a torque would be exerted on the permanent magnet by the torsion bar when the torsion bar is not in its neutral position (i.e. the position in which the bar is substantially free of torsion about is longitudinal axis). So, when an actuator is used to rotate a segment that is mounted using a torsion bar, the torsional stiffness may generate a torque counteracting the torque generated by the actuator. Therefore, when no current is supplied to the actuator coil, the permanent magnet will return to or remain in the neutral position of the torsion bar. As a consequence, when the segment has to be maintained in a position differing from the neutral position, the actuator should continuously be energized resulting in a continuous dissipation in the actuator coil.

To avoid or minimize this, the device or radiation beam uniformity adjuster according to an embodiment of the present invention is constructed to provide a position dependent torque that, at least partly, compensates the torque due to the torsional stiffness of the torsion bar, substantially without having to energize the actuator. This position dependent torque can, as an example, be generated by interaction of two magnetic members of a magnetic system. The magnetic members may include soft magnetic materials such as ferromagnetic alloys, and/or hard magnetic materials such as permanent magnets.

Figure 6A:
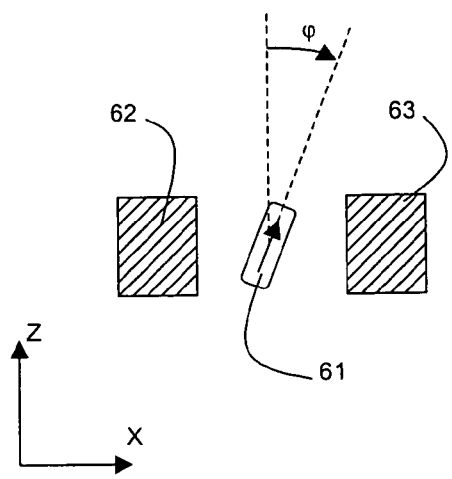
FIG. 6a shows a first example of an arrangement that provides a position dependent torque.
Figure 6B:
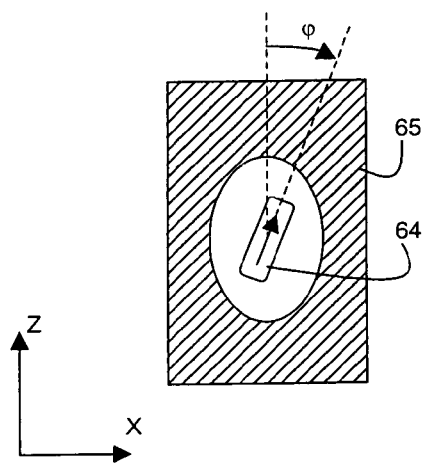
FIG. 6b schematically depicts a cross-sectional view of a magnet inserted in an oval shaped hole of a ferromagnetic part.
Figure 6C:
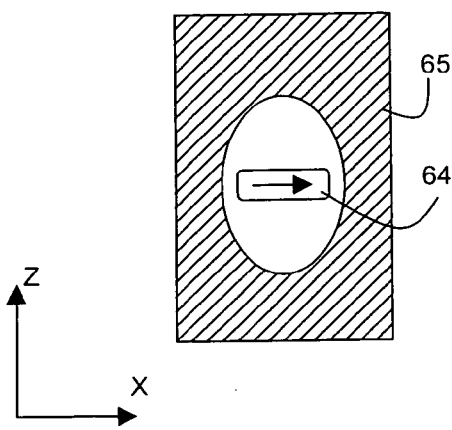
FIG. 6c schematically depicts the permanent magnet of FIG. 6b in a position having a minimal magnetic resistance.
Figure 6D:
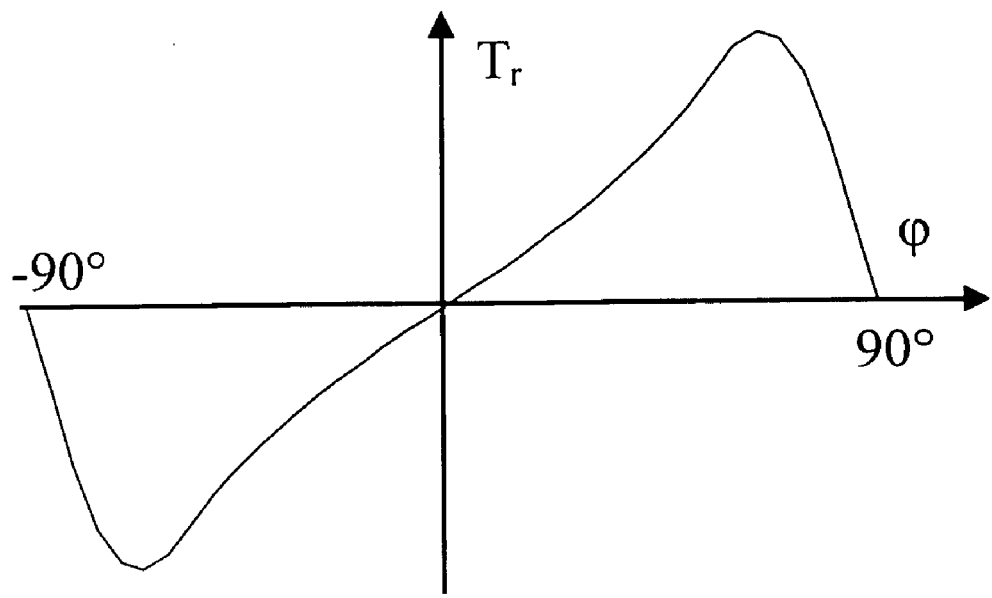
FIG. 6d schematically depicts the reluctance torque $T_r$ exerted on the permanent magnet of the arrangement of FIG. 6b.
Figure 6E:
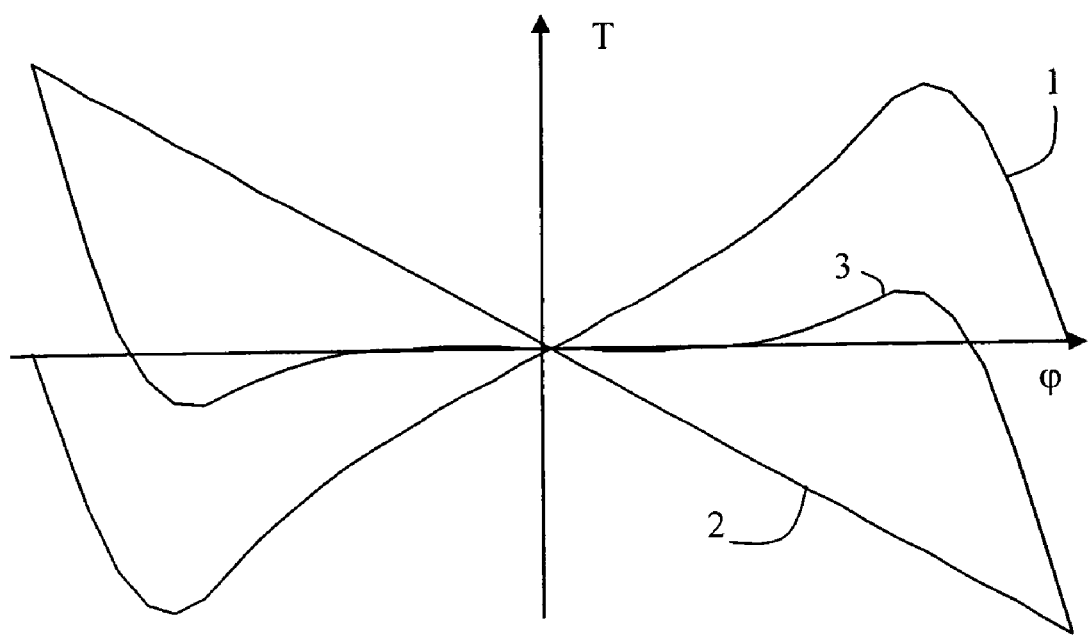
FIG. 6e schematically depicts the torsional stiffness torque, the reluctance torque and the resulting torque.

FIG. 6a shows a first example of such a magnetic system that provides a position dependent torque. FIG. 6a schematically depicts an arrangement of a permanent magnet 61 partly enclosed by two ferromagnetic parts 62, 63. In the arrangement as depicted, the interaction of the permanent magnet 61 with the ferromagnetic parts may result in a torque acting on the permanent magnet in order to align the permanent magnet with the ferromagnetic parts 62, 63 (in this position, correspond to an angle $\phi=90°$, the magnetic resistance or reluctance is minimal). FIG. 6b shows a second example of an arrangement that provides a position dependent torque. FIG. 6b schematically depicts a cross-sectional view of a magnet 64 inserted in a hole of a ferromagnetic part 65, the hole having an oval shape. Also in this arrangement, the permanent magnet experiences a force directed to displace the magnet to a position having a minimal magnetic resistance (or reluctance). This position corresponds to the position depicted in FIG. 6c. In this position, the air gap between the permanent magnet and the ferromagnetic part is minimized (for a given XZ-position of the center of the magnet). FIG. 6d schematically depicts the torque (reluctance torque $T_r$) exerted on the permanent magnet as a function of the angle $\phi$ shown in FIG. 6b. As can be seen from this figure, the reluctance torque acting on the permanent magnet at an angle $\phi=0°$ is substantially zero. In this position, the permanent magnet is at an unstable equilibrium; when the magnet is rotated from this position in either the clockwise or the counterclockwise direction, the torque exerted on the magnet will be directed in the same direction. When the magnet is free to rotate, it may find an equilibrium (a stable equilibrium) at an angle $\phi=+90°$ or $\phi=-90°$ (see FIG. 6d). When comparing the torsional stiffness torque $T_t$ exerted by the torsion bar (FIG. 3c) and the reluctance torque $T_r$ (FIG. 6d), one can see that they act in opposite directions for an angle $-90°<\phi<+90°$. Therefore, the resulting torque $T=T_t+T_r$ acting on the permanent magnet may be smaller than either the torsional stiffness torque $T_t$ or the reluctance torque $T_r$. FIG. 6e schematically depicts both torque components and the resulting torque T. Curve 1 of FIG. 6e corresponds to the position dependent torque (i.e. the reluctance torque), curve 2 corresponds to the torsional stiffness torque, curve 3 corresponds to the resulting torque. As a result, the efficiency of the actuator may improve since it would require less current to maintain the permanent magnet in a position differing from the neutral position.

It may be desirable that the permanent magnet be positioned at an angle $\phi=0°$ when the torsion bar is at its neutral position (i.e. substantially no rotation about the longitudinal axis of the torsion bar). By doing so, the resulting torque exerted on the permanent magnet is substantially zero in the neutral position.

Using calculation techniques such as Boundary Element Methods or Finite Element Methods, the proper lay-out of the permanent magnet and the ferromagnetic part may be calculated in order to, at least partly, compensate the torsional stiffness torque over a predefined operating range. The operating range may depend on the required adjustments that have to be made to the intensity of the radiation beam. A typical range to rotate the segments is $-15°<\phi<+15°$. In case the torque due to torsional stiffness is found to be varying in a substantially linear way, the torque exerted on the permanent magnet due to the presence of the ferromagnetic part should also vary in a substantially linear way but with the opposite slope such that the resulting torque on the permanent magnet may remain substantially zero over the operating range.

It should be noted that it may be desirable to have the reluctance torque $T_r$ slightly smaller than the torsional stiffness torque $T_t$ over the operating range. By doing so, one may ensure that the segment returns to the neutral position when the actuator is no longer powered.

Figure 6F:
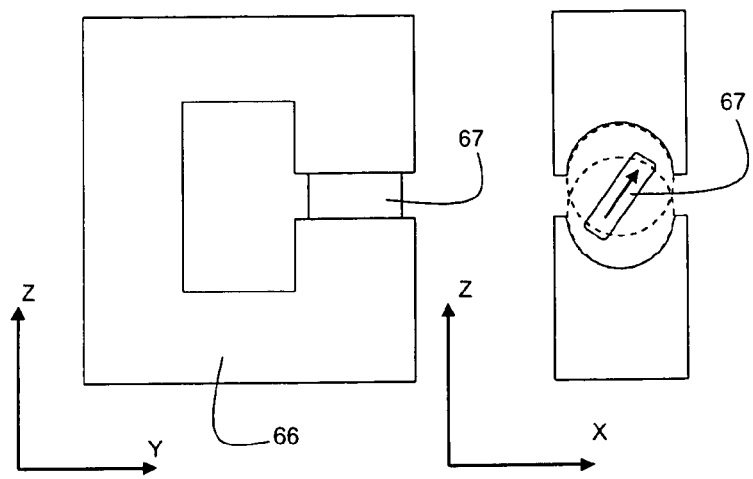
FIG. 6f schematically depicts a further arrangement of a permanent magnet and a ferromagnetic part.
Figure 6G:
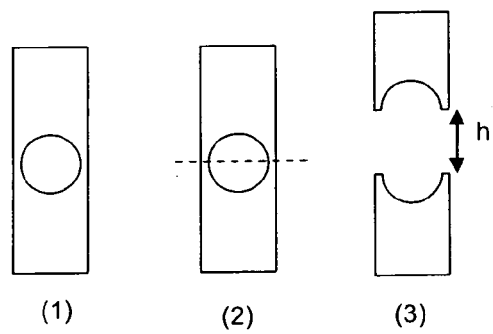
FIG. 6g schematically illustrates the manufacturing of a part of an arrangement providing a position dependent torque.

FIG. 6f schematically depicts a further magnetic system including a permanent magnet and a ferromagnetic part. In this arrangement, the ferromagnetic part consists of a rectangular yoke 66. In the ferromagnetic part a hole is provided for inserting a permanent magnet. The hole may be manufactured by cutting away two cylindrical volumes as indicated by the dotted lines. Alternatively, (see FIG. 6g) the hole may be manufactured by cutting a cylindrical hole in a ferromagnetic part (1), cutting the part along the diagonal of the cylinder (2) and placing both parts apart over a predefined distance h (3) such that the required position dependent torque is obtained.

It should be noted that an arrangement as shown in FIG. 6f provides a position dependent torque that varies substantially linear over an angle $\phi$ varying from $-30°$ to $+30°$. By altering the distance h between both parts, the slope of the position dependent torque may be altered in order to provide the appropriate compensation of the torsional stiffness torque. Therefore, by appropriate scaling of the arrangement and the proper material choice for the ferromagnetic part and the permanent magnet, such an arrangement can be applied to at least partly compensate a torsional stiffness torque (as shown in FIG. 3c) over a predefined operating range.

Figure 6H:
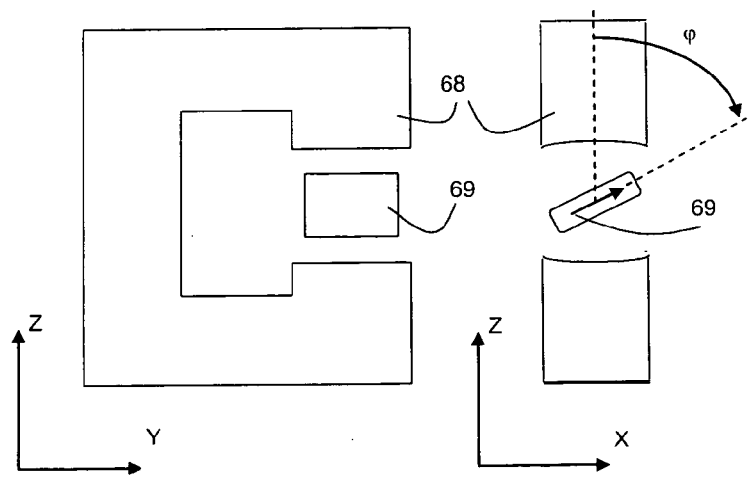
FIG. 6h schematically depicts another arrangement of a permanent magnet and a ferromagnetic part providing a position dependent torque.

The appropriate reluctance torque may also be obtained in an arrangement as shown in FIG. 6h. In this arrangement, the unstable equilibrium, that may correspond to the neutral position of the torsion bar, is found at an angle $\phi=90°$. By the appropriate modeling of the ferromagnetic part 68 surrounding the permanent magnet 69, a similar torque characteristic as shown in FIG. 6d may be obtained.

Figure 6I:
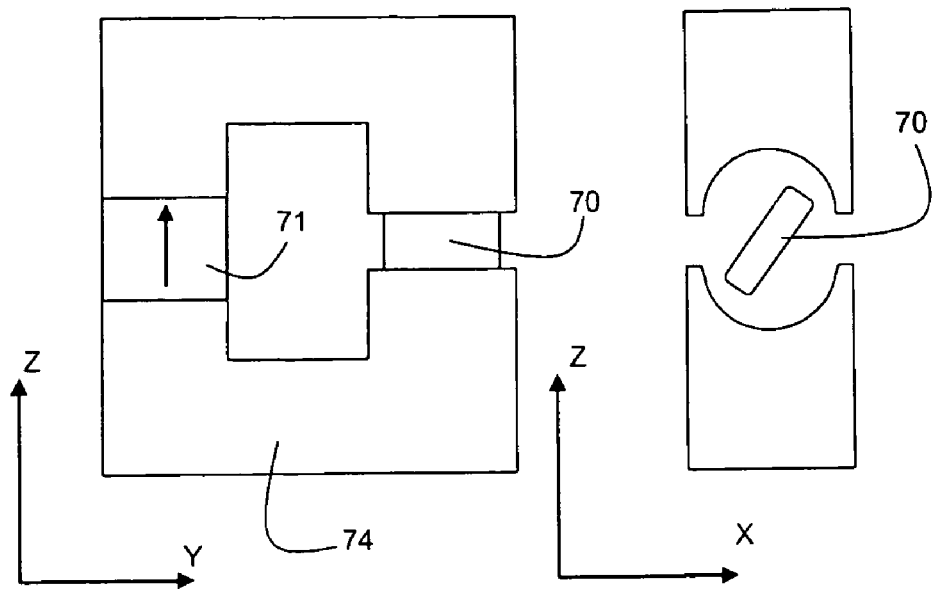
FIGS. 6i and 6j schematically depict arrangements wherein a reluctance torque is generated by incorporating a permanent magnet in the ferromagnetic part.
Figure 6J:
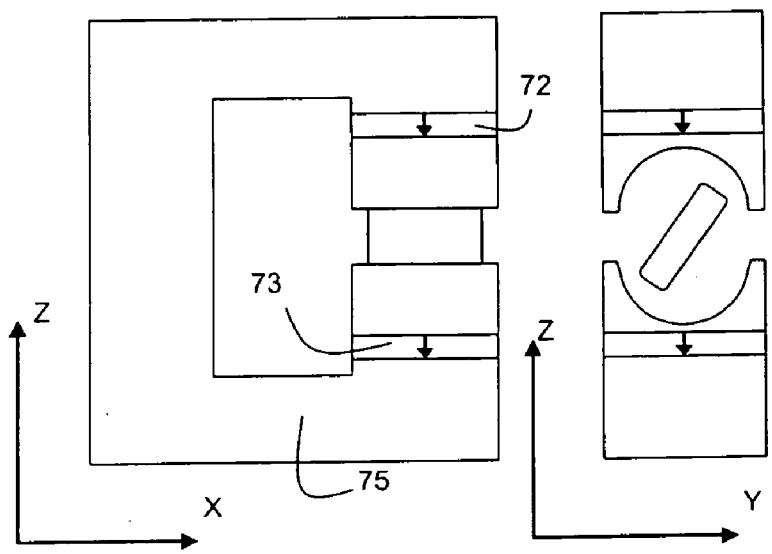

It should be noted that a reluctance torque may also be generated by incorporating a permanent magnet in the ferromagnetic part. In such an arrangement (see FIGS. 6i, 6j)

the permanent magnet as shown in FIG. 6f or 6h may be replaced by a ferromagnetic member 70. FIG. 6i schematically depicts a permanent magnet 71 arranged in a ferromagnetic yoke 74 and a ferromagnetic member 70 inserted in said yoke. In this arrangement, a position dependent torque is exerted on the ferromagnetic member due to the magnetic field of the permanent magnet. A similar arrangement is shown in FIG. 6j. In this arrangement, two permanent magnets 72 and 73 are arranged in a ferromagnetic yoke 75. These arrangements have similar properties to the arrangement shown in FIG. 6f. Also for these arrangements, conventional simulation techniques can be applied to find the appropriate dimensions and properties of the various parts in order to obtain the required reluctance torque.

Figure 6K:
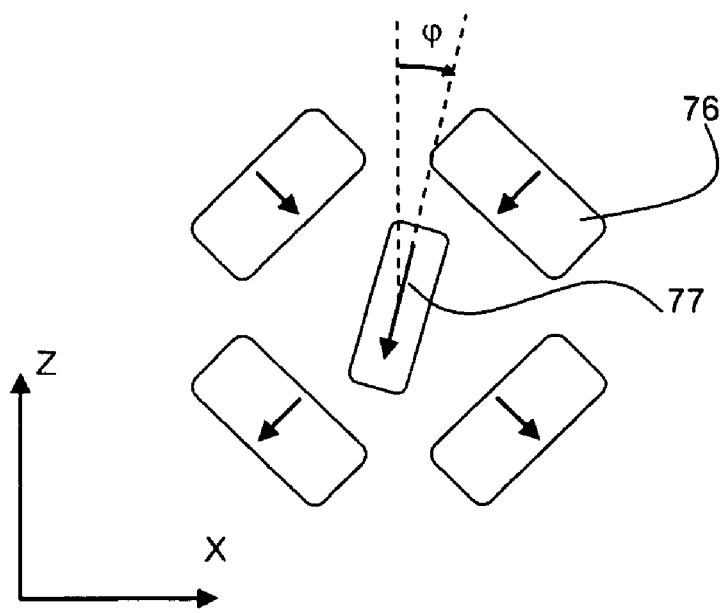
FIG. 6k schematically shows an arrangement comprising a set of 4 permanent magnets surrounding an inner magnet for generating a position dependent torque.
Figure 6L:
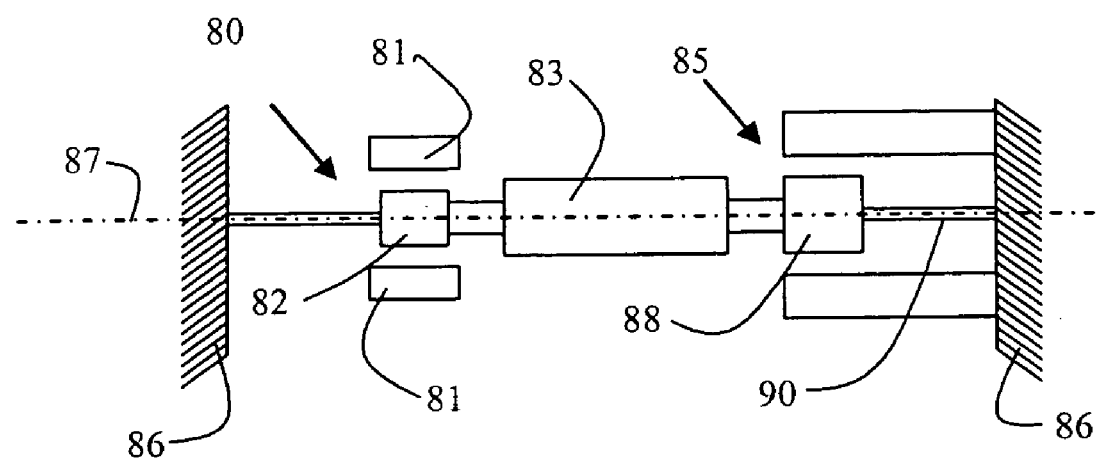
FIG. 6l schematically shows a device according to an embodiment of the present invention.

FIG. 6k shows an alternative way of generating a torque on a permanent magnet that, at least partly, can compensate a torque due to torsional stiffness of e.g. a torsion bar.

The arrangement of FIG. 6k includes a set of 4 permanent magnets 76 that surround an inner magnet 77. The interaction between the 4 permanent magnets and the inner magnet results in a torque exerted on the inner magnet. That torque is found to vary in a substantially linear way over an angle $-30° < \phi < +30°$.

The magnetic systems as described in FIG. 6a, 6b, 6f, 6h, 6i, 6j or 6k may be combined with an actuator resulting in an arrangement wherein the actuator requirements with respect to torque may substantially be reduced because the torsional stiffness torque of the torsion bar is at least partly compensated by the position dependent torque of the magnetic system. Therefore, an embodiment of the present invention may be realized by combining a magnetic system for generating a position dependent torque with an actuator for rotating a segment mounted on a torsion bar. FIG. 6i schematically depicts such a device. FIG. 6i schematically depicts a magnetic system 80 including a first part 81 mounted to a frame (not shown) and a second part 82 connected a segment 83. The arrangement further includes an actuator 85. The actuator is arranged to rotate the segment 83 about the axis 87. The segment is connected to the frame 86 via a torsion bar 90, the torsion bar exerting a torsion stiffness torque on the segment when it is rotated. To at lease partly compensate the torsional stiffness torque, the magnetic system generates a position dependent torque by interaction of the first part 81 and the second part 82. To maintain the geometric relationship between the second part 82 of the magnetic system, the segment 83 and the actuator part 88, the connections between those items (e.g. a bar or a rod) may have a torsional stiffness that is higher than the torsional stiffness of the torsion bar 90. It should further be noted that the magnetic system may also be located elsewhere, e.g. between the segment and the actuator.

Figure 7A:
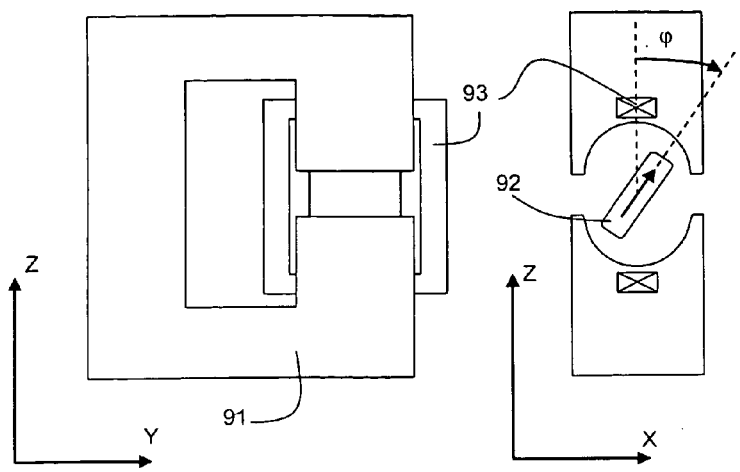
FIG. 7a schematically shows a device according to an embodiment of the present invention.
Figure 7B:
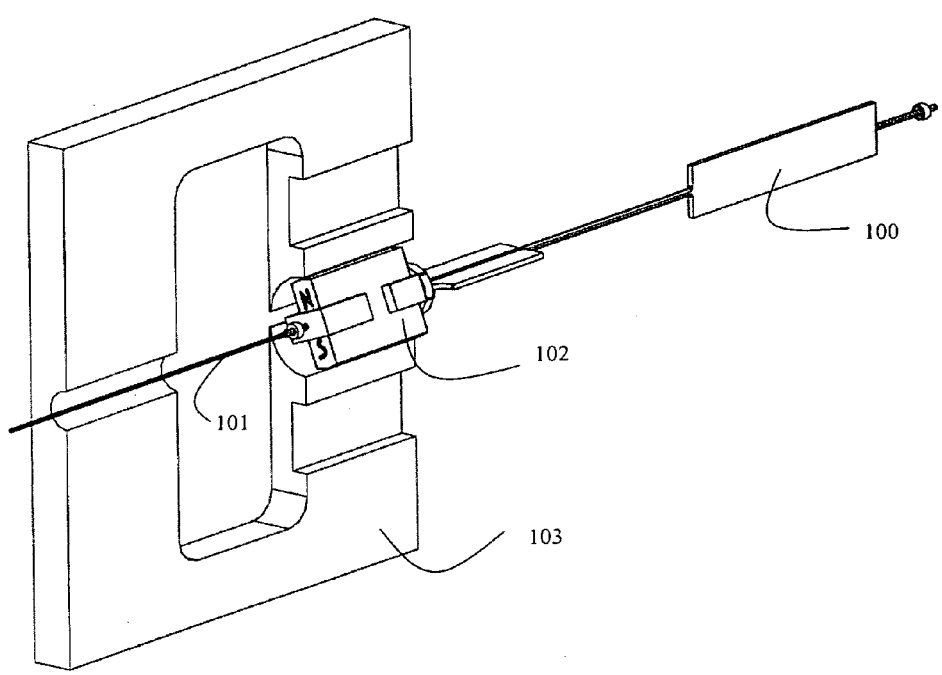
FIG. 7b schematically shows a device according to FIG. 7a in an arrangement to rotate a segment attached to a torsion bar.
Figure 7C:
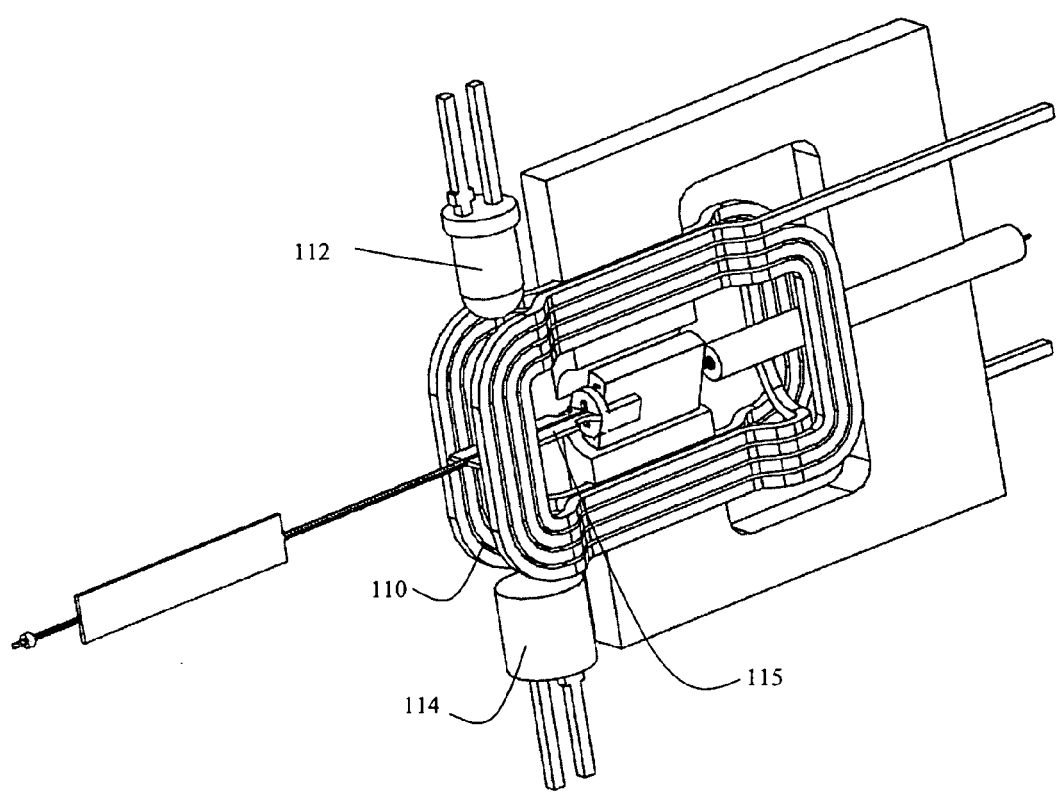
FIG. 7c shows another view of the arrangement and the segment to be rotated including the actuator coil.

In an embodiment, the position dependent torque may be generated by incorporating the magnetic system in the actuator. Such an arrangement may reduce the volumetric requirements compared to a device having an actuator and a magnetic system that operate substantially independent of each other. Such an arrangement can be obtained by combining, e.g. a magnetic system as depicted in FIG. 6a, 6f, 6h, 6i or 6j with the actuator of the arrangement as shown in FIG. 4. Such an arrangement results in an embodiment of a device or radiation beam uniformity adjuster according to the present invention. FIG. 7a schematically shows such an embodiment. FIG. 7a schematically shows an actuator including a ferromagnetic yoke 91, a permanent magnet 92 and a coil 93. The relative position of the coil 93 and the permanent magnet 92 is comparable to the actuator arrangement as shown in FIG. 5a. Therefore, when the coil 93 is supplied with a current, the permanent magnet 92 will encounter a force attempting to rotate the magnet. For a non-zero value of the angle $\phi$, the magnet also experiences a reluctance torque due to the interaction of the magnet and the ferromagnetic yoke. When such an actuator is integrated in a device for rotating a segment, an arrangement as shown in FIG. 7b may be obtained. FIG. 7b schematically shows part of an actuator according to FIG. 7a arranged to rotate a segment attached to a torsion bar. FIG. 7b schematically depicts a segment 100, a torsion bar 101 and a permanent magnet 102. The magnet is inserted in a ferromagnetic yoke 103, the yoke being constructed to receive a coil (not shown). FIG. 7c shows another view of the actuator assembly and the segment to be rotated. In this arrangement, the actuator coil 110 is shown and the device is further equipped with a detection system for detection the rotational position of the segment. As an example of such a detection system, such system may include a light source such as a LED 112, a sensor 114 and an additional segment 115. By rotation of this additional segment, the amount of light received by the sensor (light emitted by the LED) changes. The measured intensity can therefore be considered a measure for the rotational displacement of the additional segment and also for the segment.

Figure 8:
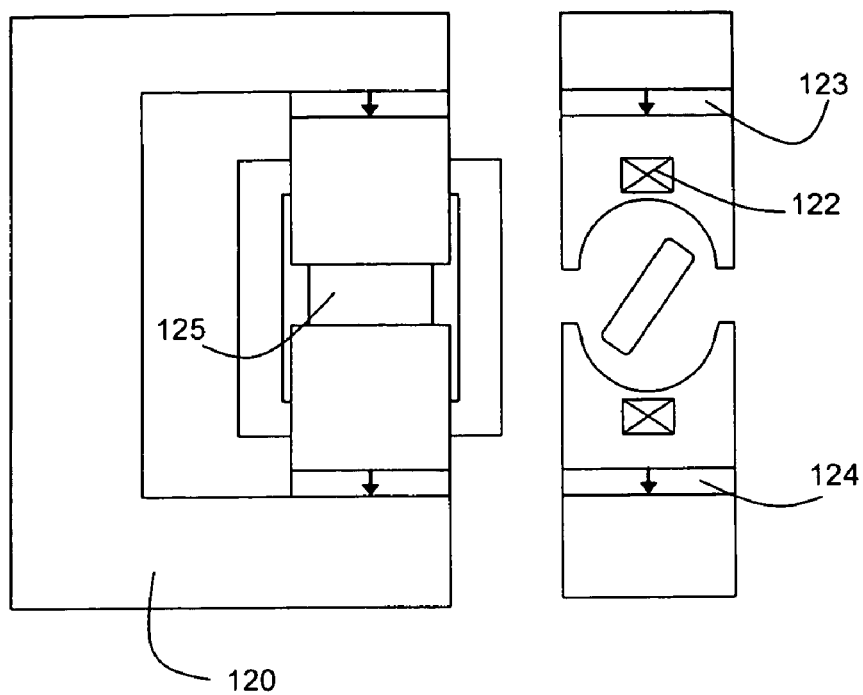
FIG. 8 schematically shows a device according to an embodiment of the invention.

FIG. 8 schematically shows a device or radiation beam uniformity adjuster according to another embodiment of the invention. In this arrangement, the reluctance torque for, at least partly, compensating the torque due to the torsional stiffness of the torsion bar, is generated using an arrangement as shown in FIG. 6j. A benefit of such an arrangement is that the thermal load on the permanent magnet may be reduced compared to the arrangements having the permanent magnet connected to the segment. FIG. 8 schematically shows a ferromagnetic yoke 120 including two permanent magnets 123 and 124 partly enclosing a ferromagnetic member 125. The arrangement further includes a coil 122. When the coil is supplied with a current, a force can be exerted on a ferromagnetic member 125 arranged for rotating the member. The member can further be connected to a segment or blade in order to rotate it.

Figure 9:
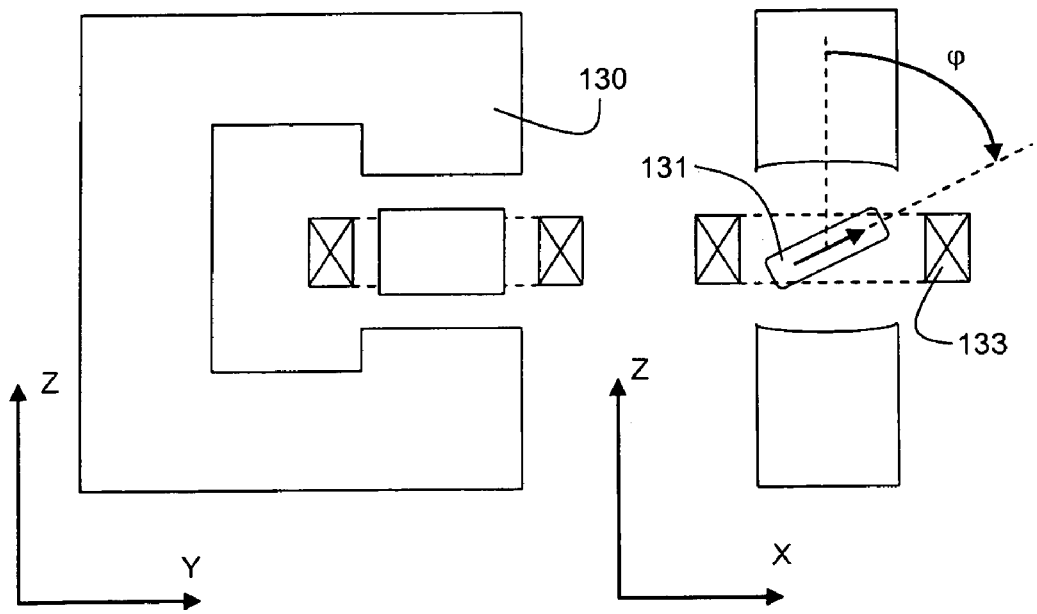
FIG. 9 schematically shows a device according to an embodiment of the present invention.

FIG. 9 schematically shows a device or radiation beam uniformity adjuster according to an embodiment of the present invention. In this embodiment, the reluctance torque is generated using an arrangement as shown in FIG. 6h. The arrangement includes a ferromagnetic yoke 130, a permanent magnet 131 and a coil 133 arranged near the permanent magnet. Note that, due to the different orientation of the permanent magnet corresponding to the neutral position of the torsion bar, the position of the coil is also different in this arrangement. When the torsion bar is in its neutral position (i.e. substantially free of torsion about its longitudinal axis) the permanent magnet is positioned in an unstable equilibrium. This position corresponds to $\phi=90°$. To exert a force on the permanent magnet in order to rotate the magnet, the coil may be arranged relative to the magnet as shown in FIG. 9. When the coil is supplied with a current, the permanent magnet will experience a force attempting to align the magnet with the magnetic field generated by the current carrying coil. An actuator according to this embodiment may also be applied in an arrangement as shown in FIGS. 7b and 7c. In such an arrangement, the permanent magnet will experience both a reluctance torque and a torsional stiffness torque in case the angle $\phi$ differs from 90°.

Figure 10:
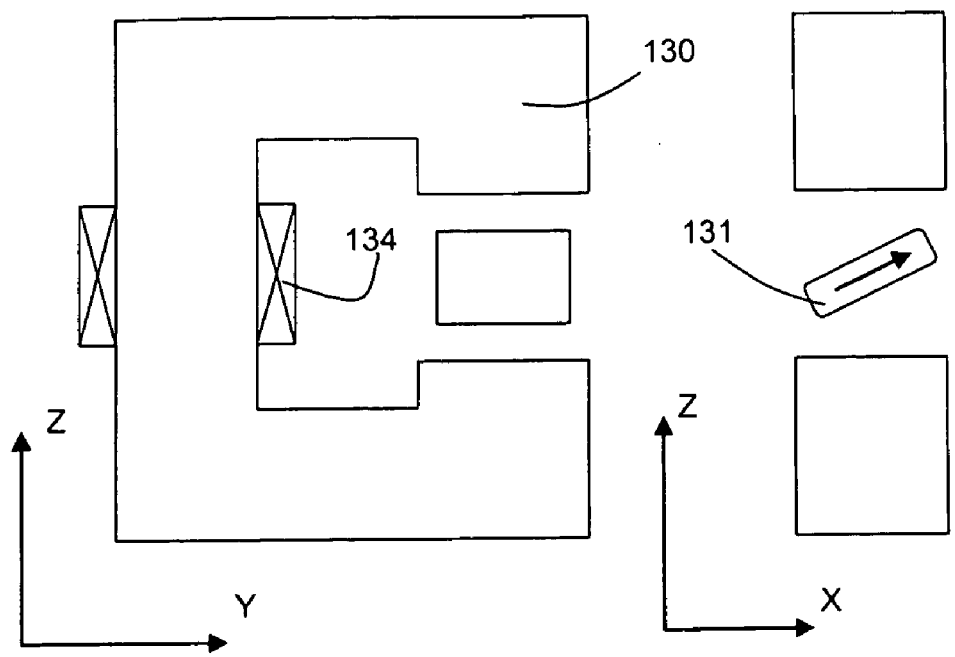
FIG. 10 schematically depicts an alternative arrangement of the embodiment shown in FIG. 10 wherein the actuator coil may is positioned on the ferromagnetic yoke.

In an alternative arrangement, the actuator coil 134 may also be positioned on the ferromagnetic yoke (see FIG. 10). By doing so, the coil may be positioned further away from the permanent magnet 131 and/or the segment. This may be beneficial to avoid thermal problems for either the coil or the permanent magnet. It may also be beneficial to apply the coil on the ferromagnetic yoke because of the available space. As an example, the coil can consist of an insulated copper wire that is wound about the ferromagnetic yoke.

Figure 11:
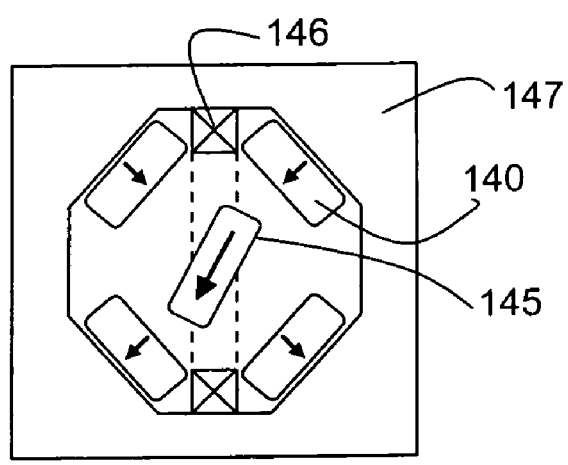
FIG. 11 schematically depicts a device according to an embodiment of the present invention.

FIG. 11 schematically depicts a device or radiation beam uniformity adjuster according to an embodiment of the present invention. In this embodiment, the position dependent torque is generated by the magnet arrangement according to FIG. 6k including an inner permanent magnet 145 surrounded by four permanent magnets 140. A coil 146 is positioned relative to the inner magnet as shown in FIG. 11. By supplying a current to the coil, the inner magnet will experience a force due to the interaction with the magnetic field of the current carrying coil. The inner magnet can be positioned relative to the outer magnets and the coil using a torsion bar arrangement such as depicted in FIG. 4. The outer magnets and the coil may be mounted to a common frame 147, which may be made of non-magnetic material.

Figure 12:
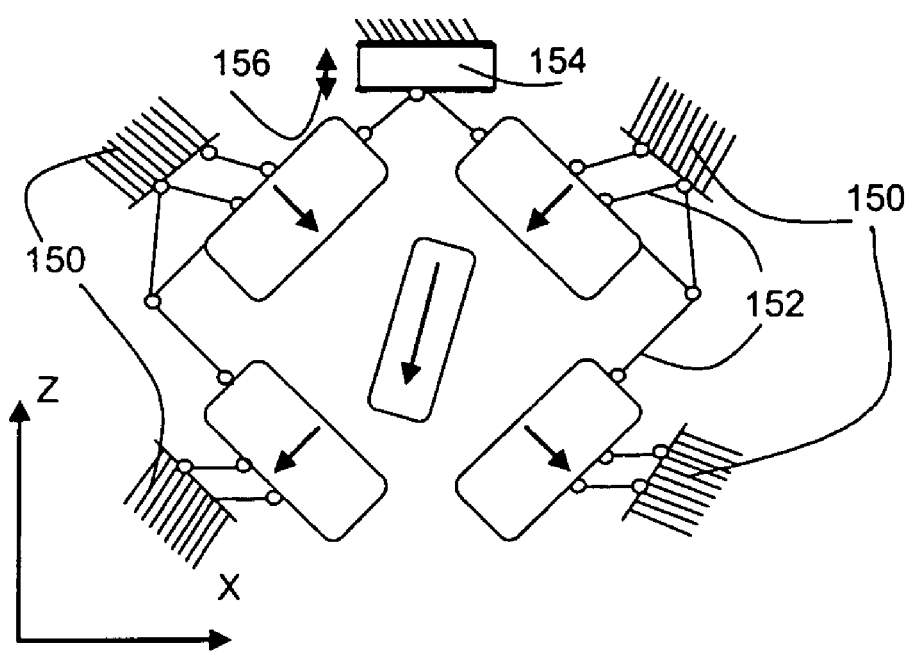
FIG. 12 schematically depicts a device according to an embodiment of the present invention.

FIG. 12 schematically depicts a device according to an embodiment of the present invention. In this embodiment, also including four permanent magnets surrounding an inner magnet, the force exerted on the inner magnet is varied by displacing the outer magnets relative to the inner magnet. This can be achieved using a construction including flexures and piezo-electric actuators. FIG. 12 schematically shows the four outer magnets connected to a frame 150 using a number of flexures 152. The arrangement further includes a piezo-electric actuator 154. By applying a voltage to the actuator, the actuator deforms in the direction as indicated by the arrow 156 thereby displacing the flexures and the magnets connected to the flexures. By doing so, the interaction between the outer magnets and the inner magnet can be altered. This may cause a rotation of the inner magnet in case it is e.g. rotatably connected to a frame. It will be clear to a person skilled in the art that the displacement of the outer magnets can be realized in a number of other ways. Each of the outer magnets may, as an example, be mounted to a frame using a piezo-actuator such that the position of each magnet can be controlled independently.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5–20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   (a) an illumination system configured to condition a radiation beam, the illumination system including a radiation beam uniformity adjuster configured to adjust the uniformity of the radiation beam, said radiation beam uniformity adjuster including
      i) a segment that is at least partly arranged in said radiation beam to block an amount of radiation of said radiation beam, said segment being mounted on a frame by a torsion bar;
      ii) an actuator configured to rotate said segment about an axis substantially parallel to a longitudinal axis of said torsion bar to change the amount of radiation of said radiation beam that passes by said segment,
      iii) a first magnetic member mounted on said torsion bar, said first magnetic member being configured to co-operate with a second magnetic member mounted on said frame to generate a position dependent torque about said longitudinal axis that is configured to at least partly compensate a torque exerted on said segment by said torsion bar,
   (b) a support structure configured to support a patterning device, the patterning device configured to pattern the radiation beam according to a desired pattern;
   (c) a substrate table configured to hold a substrate, and
   (d) a projection system configured to project the patterned radiation beam onto a target portion of said substrate.

2. The lithographic apparatus of claim 1, wherein said actuator is configured to rotate the segment such that an area of the segment projected on a plane perpendicular to a direction of said radiation beam is changed to change the amount of radiation that is blocked.

3. The lithographic apparatus of claim 1, wherein said first magnetic member comprises a permanent magnet.

4. The lithographic apparatus of claim 1, wherein said second magnetic member comprises a ferromagnetic core and a permanent magnet.

5. The lithographic apparatus of claim 3, wherein said second magnetic member comprises a plurality of permanent magnets.

6. The lithographic apparatus of claim 1, wherein said actuator comprises a coil configured to co-operate with said first magnetic member to rotate said segment.

7. The lithographic apparatus of claim 1, wherein said actuator comprises a piezo-electric element configured to displace said second magnetic member to vary the position dependent torque.

8. The lithographic apparatus of claim 1, wherein said device further comprises a detection system configured to detect a rotational position of said segment.

9. The lithographic apparatus of claim 8, wherein the detection system includes a light source, and an optical sensor.

10. The lithographic apparatus of claim 1, wherein said device comprises a plurality of segments arranged adjacent to each other.

11. The lithographic apparatus of claim 1, wherein the segment and the torsion bar are a one-piece construction.

12. The lithographic apparatus of claim 1, wherein the segment is made substantially of titanium, wolfram, molybdenum or spring steel.

13. The lithographic apparatus of claim 1, wherein the device further comprises a bar connecting the segment and the first magnetic member, said bar having a higher torsional stiffness than said torsion bar.

14. A device manufacturing method comprising:
  a) adjusting a uniformity of a radiation beam by
    i) blocking an amount of radiation of said radiation beam with a segment that is at least partly arranged in said radiation beam, said segment being mounted on a frame by a torsion bar,
    ii) rotating said segment about an axis substantially parallel to a longitudinal axis of said torsion bar to change the amount of radiation of said radiation beam, and
    iii) generating a position dependent torque about said longitudinal axis that is configured to at least partly compensate a torque exerted on said segment by said torsion bar by use of a first magnetic member mounted on said torsion bar and a second magnetic member mounted on said frame, and
  c) projecting a patterned beam of radiation onto a substrate.

15. The method of claim 14, further comprising patterning said beam of radiation to obtain said radiation beam.

16. A radiation beam uniformity adjuster configured to adjust a uniformity of a radiation beam in a lithographic apparatus, the radiation beam uniformity adjuster including:
  a) a segment mounted on a frame by a torsion bar, said segment being at least partly arranged in said radiation beam to block an amount of radiation of said radiation beam;
  b) an actuator configured to rotate said segment about an axis substantially parallel to a longitudinal axis of said torsion bar to change the amount of radiation of said radiation beam that passes by said segment, and
  c) a first magnetic member mounted on said torsion bar, said first magnetic member being configured to co-operate with a second magnetic member mounted on said frame to generate a position dependent torque about said longitudinal axis that is configured to at least partly compensate a torque exerted on said segment by said torsion bar.

17. The radiation beam uniformity adjuster of claim 16, wherein said first magnetic member comprises a permanent magnet.

18. The radiation beam uniformity adjuster of claim 16, wherein said second magnetic member comprises a ferromagnetic core and a permanent magnet.

19. The radiation beam uniformity adjuster of claim 17, wherein said second magnetic member comprises a plurality of permanent magnets.

20. The radiation beam uniformity adjuster of claim 16, wherein said actuator comprises a coil configured to co-operate with said first magnetic member to rotate said segment.

21. The radiation beam uniformity adjuster of claim 16, wherein said actuator comprises a piezo-electric element configured to displace said second magnetic member to vary the position dependent torque.

22. The radiation beam uniformity adjuster of claim 16, further comprising a detection system configured to detect a rotational position of said segment.

23. The radiation beam uniformity adjuster of claim 22, wherein the detection system includes a light source, and an optical sensor.

24. The radiation beam uniformity adjuster of claim 16, further comprising a plurality of segments arranged adjacent to each other.

25. The radiation beam uniformity adjuster of claim 16, wherein the segment and the torsion bar are a one-piece construction.

26. The radiation beam uniformity adjuster of claim 16, wherein the segment is made substantially of titanium, wolfram, molybdenum or spring steel.

27. The radiation beam uniformity adjuster of claim 16, further comprising a bar connecting the segment and the first magnetic member, said bar having a higher torsional stiffness than said torsion bar.

* * * * *